(12) United States Patent
Wu et al.

(10) Patent No.: US 11,056,683 B2
(45) Date of Patent: Jul. 6, 2021

(54) ELECTRODE PLATE PROCESSING DEVICE

(71) Applicant: CONTEMPORARY AMPEREX TECHNOLOGY CO., LIMITED, Ningde (CN)

(72) Inventors: Tiefeng Wu, Ningde (CN); Xiangqiang Huang, Ningde (CN); Tao Zhang, Ningde (CN); Nengwu Liao, Ningde (CN); Shaojun Qiu, Ningde (CN); Yuhuai Yang, Ningde (CN)

(73) Assignee: CONTEMPORARY AMPEREX TECHNOLOGY CO., LIMITED, Ningde (CN)

( * ) Notice: Subject to any disclaimer, the term of this patent is extended or adjusted under 35 U.S.C. 154(b) by 98 days.

(21) Appl. No.: 16/365,118

(22) Filed: Mar. 26, 2019

(65) Prior Publication Data

US 2019/0372098 A1 Dec. 5, 2019

(30) Foreign Application Priority Data

May 31, 2018 (CN) .......................... 201810553726.6

(51) Int. Cl.
*H01M 4/139* (2010.01)
*H01L 21/683* (2006.01)
(Continued)

(52) U.S. Cl.
CPC ........ *H01M 4/139* (2013.01); *H01L 21/6838* (2013.01); *H01L 29/401* (2013.01); *H01M 4/04* (2013.01)

(58) Field of Classification Search
CPC ... B65H 29/24; H01L 21/6838; H01L 29/401; H01M 4/04; H01M 4/0435; H01M 4/139;
(Continued)

(56) References Cited

FOREIGN PATENT DOCUMENTS

CN 106735937 A * 5/2017
CN 107 745 192 A 3/2018
(Continued)

OTHER PUBLICATIONS

Machine translation for CN 106735937 (Year: 2017).*
European Search Report dated Jul. 10, 2019, Application No. 19156657.9.

*Primary Examiner* — Lingwen R Zeng
(74) *Attorney, Agent, or Firm* — The Dobrusin Law Firm, P.C.

(57) ABSTRACT

An electrode plate processing device is provided. The electrode plate processing device includes: an electrode plate conveying mechanism configured to convey an electrode plate; a cutting mechanism disposed opposite to the electrode plate and configured to cut the electrode plate to form a tab; and a waste adsorption mechanism disposed downstream of the cutting mechanism along a conveying direction of the electrode plate. The waste adsorption mechanism includes an active driving roller, a driven support roller, and a conveyer belt that is coupled to the active driving roller and the driven support roller in a transmission way. The conveyer belt is driven by the active driving roller to rotate and configured to provide an adsorption force to a waste edge produced during the cutting of the electrode plate so as to adsorb the waste edge.

10 Claims, 3 Drawing Sheets

(51) Int. Cl.
*H01L 29/40* (2006.01)
*H01M 4/04* (2006.01)

(58) Field of Classification Search
CPC ........ H01M 4/26; H01M 4/88; H01M 4/8878; H01M 4/8896
See application file for complete search history.

(56) References Cited

FOREIGN PATENT DOCUMENTS

| | | |
|---|---|---|
| CN | 207 710 107 U | 8/2018 |
| CN | 208 173 697 U | 11/2018 |
| EP | 2 696 419 A1 | 2/2014 |
| JP | 2018 081786 A | 5/2018 |

\* cited by examiner

ELECTRODE PLATE PROCESSING DEVICE

CROSS-REFERENCE TO RELATED APPLICATIONS

The present application claims priority to Chinese Patent Application No. 201810553726.6, filed on May 31, 2018, the content of which is incorporated herein by reference in its entirety.

TECHNICAL FIELD

The present disclosure relates to the technical field of electrode plate processing technology, and in particular, relates to an electrode plate processing device.

BACKGROUND

At present, during processing of an electrode plate, a laser cutting mechanism is mainly adopted to cut the electrode plate to form a tab. However, when the laser cutting mechanism performs cutting to form the tab and thus produces waste edge, the waste edge is still connected to the electrode plate before being completely cut off, so that the waste edge that is not yet completely cut off will shake with the conveying of the electrode plate. Therefore, the laser may defocus, which degrades a cutting stability of the cutting mechanism and thus negatively affects quality of cutting the electrode plate as well as a quality of the tab to be formed. In addition, in order to minimize the shaking of the waste edge, a roller cutting method is generally required to be incorporated in the laser cutting process, and an offcut of 5-8 mm should be reserved on the electrode plate, which may lead to a waste of electrode plate material and an increase in cost.

SUMMARY

The present disclosure provides an electrode plate processing device, which can alleviate the shaking of the waste edge that is not yet completely cut off during the processing of the tab and improve the stability of subsequent cutting of the cutting mechanism.

The present disclosure provides an electrode plate processing device. The electrode plate processing device includes: an electrode plate conveying mechanism configured to convey an electrode plate; a cutting mechanism disposed opposite to the electrode plate and configured to cut the electrode plate to form a tab; and a waste adsorption mechanism disposed downstream of the cutting mechanism along a conveying direction of the electrode plate. The waste adsorption mechanism includes an active driving roller, a driven support roller, and a conveyer belt that is coupled to the active driving roller and the driven support roller in a transmission way. The conveyer belt is driven by the active driving roller to rotate and configured to provide an adsorption force to a waste edge produced during the cutting of the electrode plate so as to adsorb the waste edge.

In an embodiment, the conveyer belt is provided with a negative pressure hole, and the conveyer belt provides the adsorption force to the waste edge through the negative pressure hole.

In an embodiment, the waste adsorption mechanism further includes a vacuum roller having one or more vacuum holes, and the one or more vacuum holes are disposed at an inner side of the conveyer belt and communicate with the negative pressure hole.

In an embodiment, in an axial direction of the vacuum roller, the vacuum roller includes a vacuum section and a passing roller section that are connected to one another, the vacuum section is provided with the one or more vacuum holes, and the passing roller section is configured to support the electrode plate.

In an embodiment, at least one of the active driving roller and the driven support roller is a vacuum roller having one or more vacuum holes, and the one or more vacuum holes are disposed at an inner side of the conveyer belt and communicate with the negative pressure hole.

In an embodiment, the driven support roller is the vacuum roller, and a radial dimension of the driven support roller is greater than or equal to a radial dimension of the active driving roller.

In an embodiment, the vacuum roller has an adsorption region and a non-adsorption region that are arranged along a circumferential direction of the vacuum roller, and the adsorption region is provided with the one or more vacuum holes.

In an embodiment, the one or more vacuum holes include a plurality of vacuum holes, and the plurality of vacuum holes is arranged along a circumferential direction of the vacuum roller.

In an embodiment, a limit groove surrounding the vacuum roller is provided along a circumferential direction of the vacuum roller, the limit groove has a bottom wall provided with the one or more vacuum holes, and the conveyer belt is engaged in the limit groove.

In an embodiment, the waste adsorption mechanism further includes a tension roller provided on an outer side of the conveyer belt, and configured to adjust a tension force of the conveyer belt.

The technical solutions according to the present disclosure bring the following beneficial effects.

It should be understood that the above general description is merely illustrative, but not intended to limit the present disclosure.

REFERENCE SIGNS

10—electrode plate conveying mechanism;
11—cutting mechanism;
12—waste adsorption mechanism;
120—active driving roller;
121—driven support roller;
122—conveyer belt;
123—vacuum roller;
  1230—vacuum section;
    12301—vacuum hole;
    12302—limit groove;
  1231—passing roller section;
124—drive motor;
125—coupler;
126—negative pressure tube;

127—tension roller;
13—electrode plate;
130—waste edge;
14—waste collector;
15—auxiliary roller.

Accompanying drawings illustrating embodiments according to the present disclosure are incorporated in the description as a part, and used to elaborate the principle of the present disclosure.

DESCRIPTION OF EMBODIMENTS

The present disclosure will be further described below by specific embodiments of the present disclosure in combination with the drawings.

Figure 1:
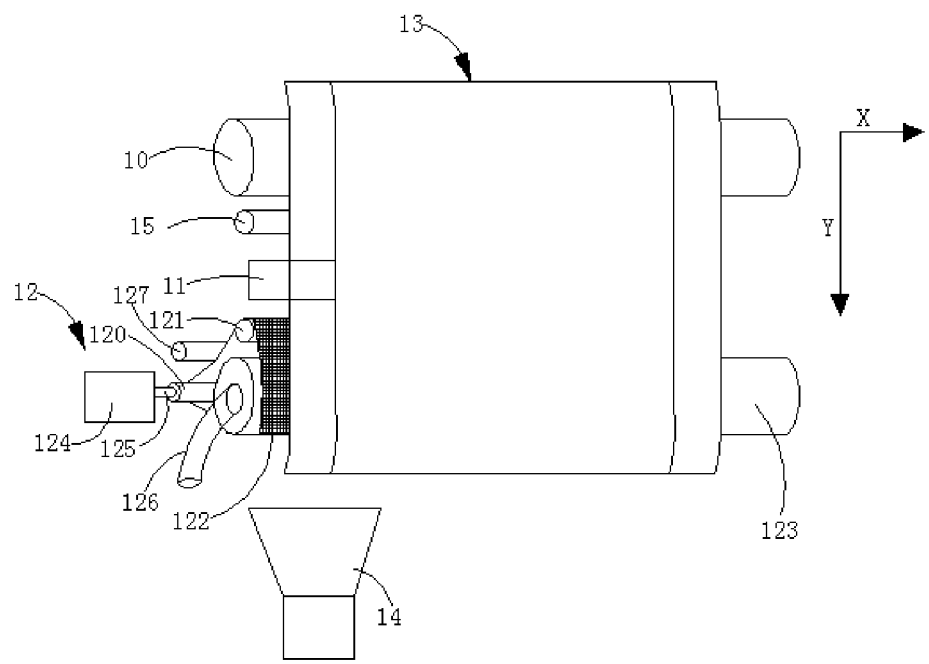
FIG. 1 to FIG. 3 are schematic diagrams of respective procedures in a process of processing an electrode plate with an electrode plate processing device according to an embodiment of the present disclosure.
Figure 2:
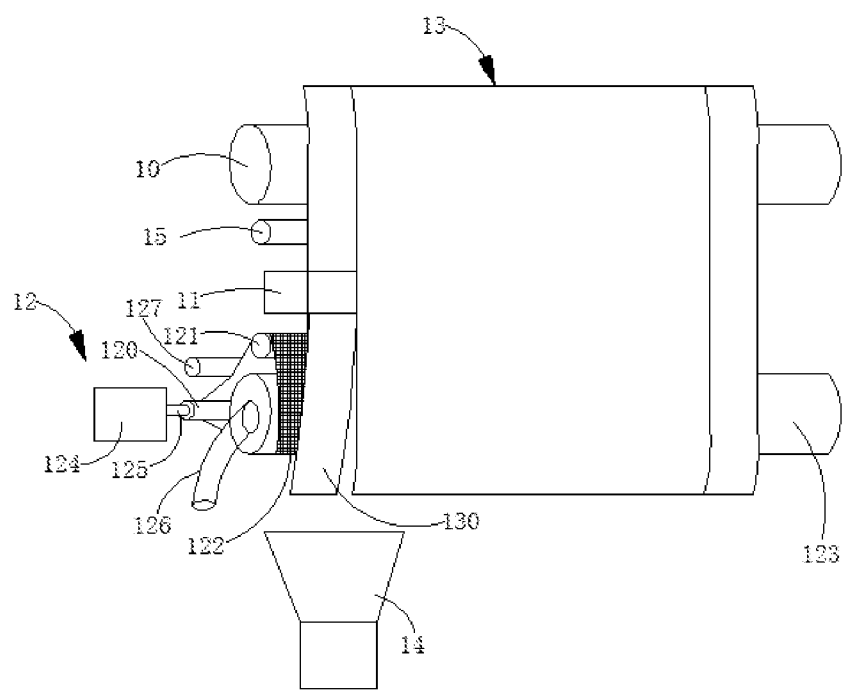
Figure 3:
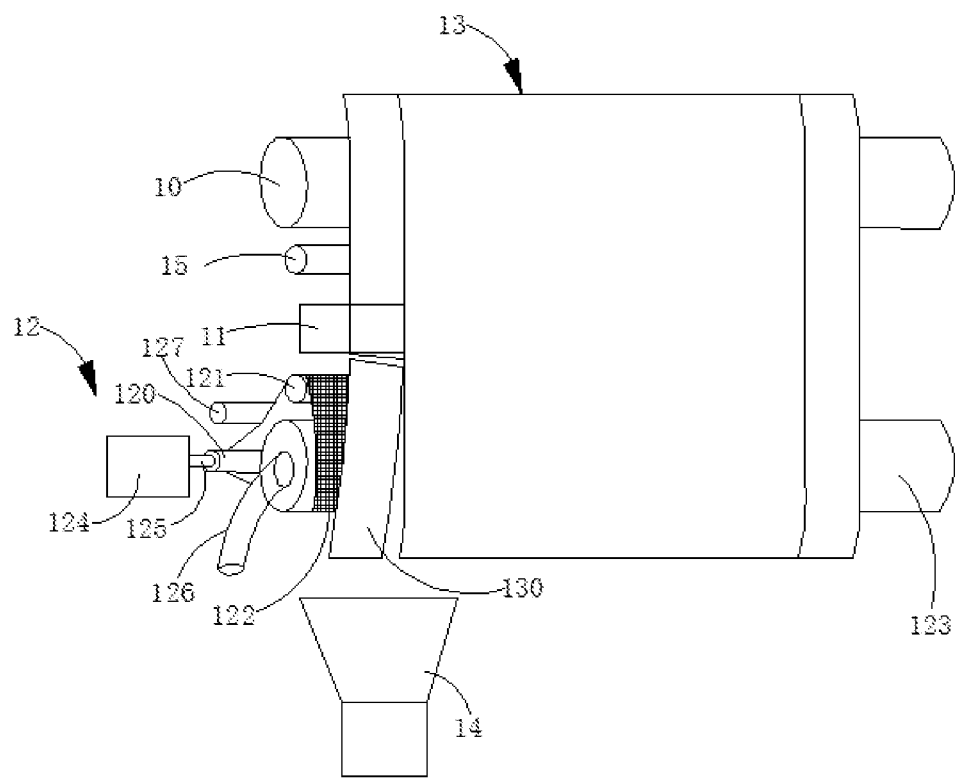

The present disclosure provides an electrode plate processing device for processing an electrode plate 13. As shown in FIGS. 1 to 3, the electrode plate 13 includes an exposed foil region and a coated region. The coated region is a portion of the electrode plate 13 coated with an active material layer, and the exposed foil region is a portion of the electrode plate 13 uncoated with the active material layer. In a width direction of the electrode plate 13 (direction X as shown in FIG. 1), the exposed foil region can be located on one side of the coated region or on both sides of the coated region, and also can be located between adjacent coated regions.

The electrode plate processing device can include an electrode plate conveying mechanism 10 and a cutting mechanism 11. The electrode plate conveying mechanism 10 is configured to convey the electrode plate 13. The electrode plate conveying mechanism 10 can include a drive roller configured to perform the conveying of the electrode plate 13. The electrode plate conveying mechanism 10 can also include a passing roller. There can be plurality of passing rollers arranged. "A plurality of" used herein indicates a number of at least two. Along a direction in which the electrode plate 13 is conveyed, the passing rollers can be provided both upstream and downstream of the cutting mechanism 11, in order to ensure a stability of conveying the electrode plate 13. The electrode plate processing device has a cutting position, where the cutting mechanism 11 is located. During the conveying of the electrode plate 13, the electrode plate 13, which is conveyed by the electrode plate conveying mechanism 10, passes the cutting position. That is, the cutting mechanism 11 can be disposed opposite to the electrode plate 13, so as to cut the electrode plate 13 and form a tab. The cutting mechanism 11 can be a laser cutting mechanism that can continuously cut the electrode plate 13, thereby improving an efficiency of making the tab.

It should be understood that the tab is a part belonging to the exposed foil region. In other words, the cutting mechanism 11 cuts the exposed foil region to form the tab. However, in view of a processing precision of the electrode plate and a problem of exposing foil during the processing, a cutting path of the cutting mechanism 11 generally is required to pass through the coated region. That is, the waste edge 130 obtained by cutting of the cutting mechanism can have an exposed foil region and a coated region.

As shown in FIGS. 2 and 3, the waste edge 130 may be produced during the cutting mechanism 11 cutting the electrode plate 13 and forming the tab. In order to alleviate the shaking of the waste edge 130, which is not yet completely cut off at the present moment and thus partially connected to the electrode plate 13 (as shown in FIG. 2), the electrode plate processing device further includes a waste adsorption mechanism 12. Along the conveying direction of the electrode plate 13 (a direction Y as shown in FIG. 1), the waste adsorption mechanism 12 is disposed downstream of the cutting mechanism 11 and configured to adsorb the waste edge 130.

As used herein, "upstream" and "downstream" respectively indicate the sequence of processing the electrode plate, rather than limiting the spatial position of respective components.

Specifically, as shown in FIGS. 1 to 3, the waste adsorption mechanism 12 includes an active driving roller 120, a driven support roller 121, and a conveyer belt 122 that is coupled to the active driving roller 120 and the driven support roller 121 in a transmission way. The active driving roller 120 is coupled to a drive motor 124 via a coupler 125, and the drive motor 124 can drive the active driving roller 120 to rotate. The conveyer belt 122 is configured to provide the waste edge 130 with an adsorption force, so as to adsorb the waste edge 130 (the waste edge 130 is not yet completely cut off, as shown in FIG. 2). In addition, the active driving roller 120 can drive the conveyer belt 122 to rotate. When the conveyer belt 122 performs the conveying, the conveyer belt 122 provides a certain tension force to the waste edge 130 adsorbed thereon, so that the waste edge 130 is maintained in a tension state under the tension force, thereby effectively lowering a risk of laser defocusing caused by the shaking of the waste edge 130. In this way, the cutting stability of the electrode plate 13 with the cutting mechanism 11 can be enhanced, and thus the cutting quality of the electrode plate 13 and the quality of the tab to be formed both can be improved, which can further enhance the performance of the battery. In addition, such design no longer requires reserving a cutoff on the electrode plate 13, thereby improving the utilization of the electrode plate 13 and reducing the processing cost of the electrode plate 13. The driven support roller 121 is configured to support the conveyer belt 122 and to rotate under the driving of the conveyer belt 122. Such design can reduce the friction between the driven support roller 121 and the conveyer belt 122, thereby reducing an abrasion of the conveyer belt 122 and prolonging the service life of the conveyer belt 122.

Once the waste edge 130 is completely cut off, as shown in FIG. 3, the waste edge 130 can be separated from the electrode plate in time with the rotation of the conveyer belt 122, and then collected by a waste collector 14.

Further, in order to prevent the conveyer belt 122 from slipping, the waste adsorption mechanism 12 further includes a tension roller 127. The tension roller 127 is provided on an outer side of the conveyer belt 122 (the outer side is a side of the conveyer belt 122 facing away from the active driving roller 120 or the driven support roller 121). In addition, the tension roller 127 can adjust a wrap angle between the conveyer belt 122 and the active driving roller 120 as well as a wrap angle between the conveyer belt 122 and the driven support roller 121, so as to adjust the tension force of the conveyer belt 122, thereby ensuring a movement stability of the conveyer belt 122. In this way, the waste edge 130 adsorbed on the conveyer belt 122 can be kept tight all the time, which in turn can improve the cutting stability if the cutting mechanism 11.

In an embodiment, during the operating of the electrode plate processing device, a rotational speed of the active driving roller 120 can be set to be greater than a conveying speed of the electrode plate conveying mechanism 10. Since the conveyer belt 122 is driven by the active driving roller 120 to rotate and the electrode plate conveying mechanism 10 is used to convey the electrode plate 13, a conveying speed of the conveyer belt 122 is greater than a conveying speed of the electrode plate 13, so that the waste edge 130 adsorbed on the conveyer belt 122 is always in the tension state during the conveying of the electrode plate 13. In this way, a material accumulation of the waste edge 130 is less likely to occur, such that the cutting stability of the cutting mechanism 11 can be enhanced, and thus the cutting quality of the electrode plate 13 and the quality of the tab to be formed both can be improved.

It should be understood that, since the conveyer belt 122 is driven by the active driving roller 120 to rotate and the active driving roller 120 is driven by the drive motor 124, the conveying speed of the conveyer belt 122 is controlled by a rotational speed of the drive motor 124. For example, the rotational speed of the drive motor 124 can be adjustable in such a manner that the tension force exerted on the waste edge 130 that is adsorbed on the conveyer belt 122 can be adjusted.

Further, the aforementioned waste adsorption mechanism 12 can be an adhesive adsorption mechanism, a magnetic adsorption mechanism, a negative pressure adsorption mechanism, or the like. That is, the conveyer belt 122 in the waste adsorption mechanism 12 provides the waste edge 130 with the adsorption force in a form of a bonging force, a magnetic force or a negative pressure. In an example, the waste adsorption mechanism 12 according to the present embodiment can be a negative pressure adsorption mechanism. Specifically, a negative pressure hole can be provided on the conveyer belt 122 of the waste adsorption mechanism 12, and the conveyer belt 122 can provide adsorption force (i.e., negative pressure) to the waste edge 130 through the negative pressure hole, so as to adsorb the waste edge 130 on the conveyer belt 122. Comparing with the adhesive adsorption mechanism, such design can reduce the difficult of the waste edge 130 peeling off from the conveyer belt 122, where the waste edge 130 has been completely cut off, and thus can facilitate a collection of the waste edge 130. Specifically, the waste edge 130 that is completely cut off can be detached from the conveyer belt 122 under an effect of its own gravity or a suction force of the waste collector 14, as long as the negative pressure acting on the waste edge 130 is removed. In addition, comparing with the magnetic adsorption mechanism, such design can simplify the structure of the waste adsorption mechanism 12 and thus reduce the production cost of the waste adsorption mechanism 12.

In an embodiment, as shown in FIGS. 1 to 3, the waste adsorption mechanism 12 further includes a vacuum roller 123, and the vacuum roller 123 can communicate with a negative pressure device (not shown) through a negative pressure tube 126. The vacuum roller 123 has a vacuum hole 12301. There can be a plurality of vacuum holes 12301 arranged. The plurality of vacuum holes 12301 can be located at an inner side of the conveyer belt 122 (the inner side refers to a side of the conveyer belt 122 facing away from the electrode plate 13), and communicates with the negative pressure hole. In this embodiment, by providing the vacuum roller 123, the negative pressure provided by the negative pressure device can be intensively applied to the waste edge 130 through the vacuum holes 12301 and the negative pressure hole, so that the waste edge 130 can be stably adsorbed on the conveyer belt 122 and the shaking of the waste edge 130 can be alleviated.

Since the waste edge 130 has a small width dimension (i.e., a dimension in the width direction of the electrode plate), the manufacturing of the vacuum roller 123 may be more difficult if an axial dimension (a dimension in the direction X as shown in FIG. 1) of the entire vacuum roller 123 is designed to be the same as the width dimension of the waste edge 130. If the axial dimension of the vacuum roller 123 is designed to be larger than the width dimension of the waste edge 130, a part of the adsorption force exerted on the waste edge 130 by the vacuum roller 123 will be applied to the coated region of the electrode plate 13, which is disadvantage to the stable conveying of the electrode plate 13. In order to solve these technical problems, the vacuum roller 123 can be divided into two sections along its axial direction. Specifically, in the axial direction of the vacuum roller 123, the vacuum roller 123 includes a vacuum section 1230 and a passing roller section 1231 that are connected to one another. The vacuum section 1230 is a hollow structure, and provided with vacuum holes 12301. That is, the vacuum section 1230 is configured to adsorb the waste edge 130 onto the conveyer belt 122. In contrast, the passing roller section 1231 is a solid structure located below the coated region of the electrode plate 13, and does not communicate with the negative pressure device. The passing roller section 1231 is primarily configured to support the electrode plate 13 to ensure the stable conveying of the electrode plate 13. In other words, in the present embodiment, by designing the vacuum roller 123 in sections, on the one hand, the difficulty of processing the vacuum roller 123 can be reduced, and on the other hand, the stability of conveying the electrode plate 13 can be guaranteed.

Since the coated region of the electrode plate 13 is usually coated with an active material layer on its two opposite sides in a thickness direction, the coated region of the electrode plate 13 has a larger thickness than the exposed foil region. When conveying the electrode plate 13, a passing roller, a driving roller of the electrode plate conveying mechanism 10 or the passing roller section 1231 mentioned above mainly contacts the coated region of the electrode plate 13, so that the exposed region may not be completely tensioned, and the cutting of the tab by the cutting mechanism 11 may be affected. In order to solve this problem, the exposed foil region can be supported by the driven support roller 121, i.e., the driven support roller 121 can not only support the conveyer belt 122, but also support the exposed foil region, so as to allow the exposed foil region to be in the tension state and facilitate cutting of the tab by the cutting mechanism 11.

It should be noted that, in order to increase the tension force applied on the exposed foil region, in addition to the driven support roller 121 for supporting the exposed foil region, as shown in FIGS. 1 to 3, the electrode plate processing device further includes an auxiliary roller 15 for supporting the exposed foil region. In the conveying direction of the electrode plate, the auxiliary roller 15 is arranged upstream of the cutting mechanism 11. That is, the cutting mechanism 11 is disposed between the auxiliary roller 15 and the driven support roller 121, so that the tension force applied on the exposed foil region can be guaranteed, thereby enhancing the cutting stability of the cutting mechanism 11.

In an embodiment, in the conveying direction of the electrode plate 13, the aforementioned vacuum roller 123 is disposed downstream of the driven support roller 121. After the waste edge 130 is completely cut off and the vacuum roller 123 stops applying adsorption force to the waste edge 130, the waste edge 130 peels off from the conveyer belt 122 under the effect of its own gravity or the suction force of the waste collector 14, which can facilitate a collection of the waste edge 130. If the vacuum roller 123 is disposed upstream of the driven support roller 121, when the waste edge 130 is completely cut off and the vacuum roller 123 stops applying adsorption force to the waste edge 130, the waste edge 130 that is completely cut off is still supported on the conveyer belt 122. However, at this moment, since the waste edge 130 that is completely cut off is not adsorbed, the waste edge 130 may move randomly with the conveying of the conveyer belt 122, which can be detrimental to the conveying of the electrode as well as the collection. In view of this, according to the present embodiment, the vacuum roller 123 can be disposed downstream of the driven support roller 121.

Further, the vacuum roller 123 is disposed farther from the exposed foil region than the driven support roller 121. When the vacuum roller 123 applies the adsorption force to the waste edge 130 through the conveyer belt 122, the waste edge 130 deviates towards a direction away from the conveying direction of the electrode plate, i.e., there is an angle between a moving direction of the waste edge 130 and the conveying direction of the electrode plate. In this way, the waste edge 130, after being completely cut off, can peel off from the conveyer belt 122 under the effect of its own gravity or the suction force of the waste collector 14, thereby improving an efficiency of collecting the waste edge 130.

In addition, in the conveying direction of the electrode plate 13, the waste adsorption mechanism 12 is disposed downstream of the cutting mechanism 11. Thus, it is obvious that the driven support roller 121 is disposed downstream of the cutting mechanism 11, and as an example, the cutting mechanism 11 is disposed adjacent to the driven support roller 121. That is, the cutting mechanism 11 and the driven support roller 121 can be as close as possible, provided that they do not interfere with one another. Such design allows the waste edge 130 cut by the cutting mechanism 11 can be quickly lapped on the driven support roller 121, so as to avoid a situation in which the cutting mechanism 11 is too far away from the driven support roller 121 so that the waste adsorption mechanism 12 fails to adsorb the waste edge 130 in time. In this way, the stability of adsorbing the waste edge 130 can be improved, and the shaking of the waste edge 130 can be alleviated.

In an embodiment, at least one of the active driving roller 120 and the driven support roller 121 is a vacuum roller 123. The vacuum roller 123 has a hollow structure and is capable of communicating with a negative pressure device through a negative pressure tube 126. The vacuum roller 123 has vacuum holes 12301, and the vacuum holes 12301 are located at an inner side of the conveyer belt 122 (the inner side refers to a side of the conveyer belt 122 facing away from the electrode plate 13) and communicates with the negative pressure hole. In this embodiment, since at least one of the active driving roller 120 and the driven support roller 121 is the vacuum roller 123, on the one hand, the negative pressure provided by the negative pressure device can be intensively applied to the waste edge 130 through the vacuum holes 12301 and the negative pressure hole, so that the waste edge 130 can be stably adsorbed on the conveyer belt 122, and the shaking of the waste edge 130 can be alleviated. On the other hand, such design no longer requires a separate vacuum roller 123, thereby reducing the cost of the waste adsorption mechanism 12.

Since the active driving roller 120 is required to be connected to the drive motor 124, if the active driving roller 120 is designed as the vacuum roller 123, the strength of the connection between the drive motor 124 and the active driving roller 120 is lowered on the one hand, and the communication between active driving roller 120 and the negative pressure device is negatively affected on the other hand. Therefore, as an example of the present embodiment, the driven support roller 121 can be designed as the aforementioned vacuum roller 123.

In order to improve the stability of adsorbing the waste edge 130, a radial dimension of the driven support roller 121 can be designed to be large. For example, the radial dimension of the driven support roller 121 can be designed to not be smaller than a radial dimension of the active driving roller 120. That is, the radial dimension of the driven support roller 121 is larger than or equal to the radial dimension of the active driving roller 120, so as to ensure a sufficient adsorption area of the driven support roller 121. In this way, the stability of adsorbing the waste edge 130 can be improved and the production cost of the waste adsorption mechanism 12 can also be reduced.

Figure 4:
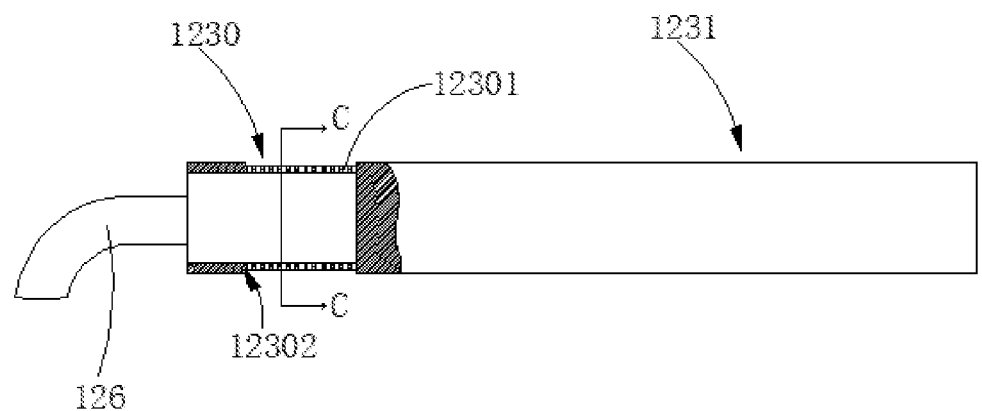
FIG. 4 is a partial cross-sectional view of a vacuum roller in an electrode plate processing device according to an embodiment of the present disclosure.
Figure 5:
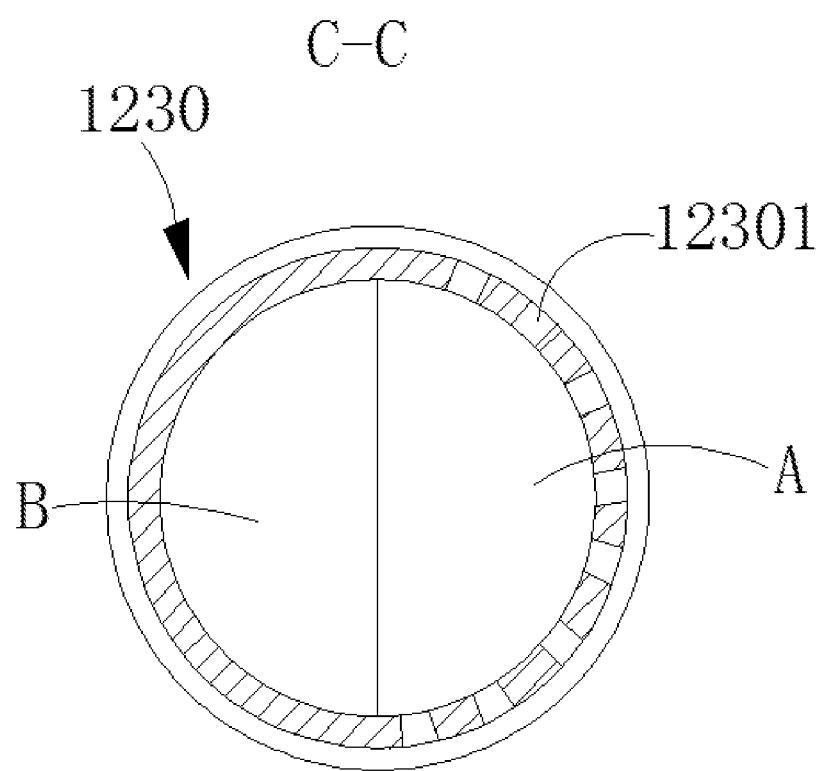
FIG. 5 is a cross-sectional view of the vacuum roller along C-C shown in FIG. 4.

In an embodiment, the aforementioned vacuum roller 123 has an adsorption region A and a non-adsorption region B that are arranged along a circumferential direction of the vacuum roller 123, as shown in FIG. 4 and FIG. 5. The adsorption region A is provided with vacuum holes 12301 communicating with the inside of the vacuum roller 123, and the non-adsorption region B is not provided with the vacuum hole 12301. The adsorption region A of the vacuum roller 123 faces toward the waste edge 130. When the vacuum holes 12301 on the adsorption region A communicate with the negative pressure hole on the conveyer belt 122, the negative pressure provided by the negative pressure device can pass through the vacuum holes 12301 and the negative pressure hole in sequence and act on the waste edge 130, so as to adsorb the waste edge 130 on the conveyer belt 122. When the waste edge 130 is completely cut off, the vacuum roller 123 will be rotated in such a manner that its non-adsorption region B faces towards the waste edge 130. Since the non-adsorption region B is not provided with the vacuum hole 12301, the negative pressure provided by the negative pressure device cannot act on the waste edge 130 located on the conveyer belt 122. In other words, at this moment, the waste edge 130 that has been completely cut off is no longer subjected to the adsorption force. In this way, the waste edge 130 that has been completely cut off peels off from the conveyer belt 122 under the effect of its own gravity or the suction force of the waste collector 14.

It should be understood that, the vacuum holes 12301 mentioned above are arranged along the circumferential direction of the vacuum roller 123. That is, the adsorption region A can extend over the entire circumference of the vacuum roller 123. When there is need to adsorb the waste edge 130, it is only required to open the negative pressure device, such that the negative pressure provided by the negative pressure device passes through the vacuum holes 12301 and the negative pressure hole in sequence and then acts on the waste edge 130, so as to achieve the adsorption of the waste edge 130. When it is needed to release the waste edge 130 that has been completely cut off, it is only required to turn off the negative pressure device, and the waste edge 130 that has been completely cut off is no longer subjected to the negative pressure and thus can be released.

In addition, in order to prevent a shift of the conveyer belt 122 along the axial direction of the vacuum roller 123, a limit groove 12302 surrounding the vacuum roller 123 is provided along the circumferential direction of the vacuum roller 123. The conveyer belt 122 can be engaged in the limit groove 12302. That is, the shift of the conveyer belt 122 along the axial direction of the vacuum roller 123 can be limited by providing the limit groove 12302 on the vacuum roller 123. Such design can ensure the moving stability of the conveyer belt 122, and thus guarantee the tension force exerted on the waste edge 130 that is adsorbed on the conveyer belt 122, thereby ensuring the cutting stability of the cutting mechanism 11.

As an example, a bottom wall of the limit groove 12302 (the bottom wall is a portion of the groove 12302 facing the conveyer belt 122) is provided with the vacuum holes 12301, and the vacuum holes 12301 communicate with the negative pressure hole on the conveyer belt 122. That is, the negative pressure provided by the negative pressure device can pass through the vacuum holes 12301 and the negative pressure hole on the conveyer belt 122 in sequence and then act on the waste edge 130, so as to achieve the adsorption of the waste edge 130.

The embodiments according to the present disclosure discussed above are merely illustrative embodiments, but not intended to limit the present disclosure. The technical solution according to the present disclosure can be modified in various manners. Any modifications, equivalent replacements, improvements within the spirit and principles of the present disclosure should be included in the scope of protection of the present disclosure.

What is claimed is:

1. An electrode plate processing device, comprising: an electrode plate conveying mechanism configured to convey an electrode plate, the electrode plate comprising a coated region coated with an active material layer and an exposed foil region uncoated with the active material layer;
   a cutting mechanism disposed opposite to the electrode plate and configured to cut the exposed foil region of the electrode plate to form a tab;
   a waste adsorption mechanism entirely disposed downstream of the cutting mechanism along a conveying direction of the electrode plate, wherein the waste adsorption mechanism comprises an active driving roller, a driven support roller, and a conveyer belt that is coupled to the active driving roller and the driven support roller in a transmission way, and the conveyer belt is driven by the active driving roller to rotate and configured to provide a negative pressure to a waste edge produced during the cutting of the electrode plate so as to adsorb the waste edge, wherein a rotational speed of the active driving roller is greater than a conveying speed of the electrode plate conveying mechanism; and
   an auxiliary roller arranged upstream of the cutting mechanism and configured to support the exposed foil region.

2. The electrode plate processing device according to claim 1, wherein the conveyer belt is provided with a negative pressure hole, and the conveyer belt provides the negative pressure to the waste edge through the negative pressure hole.

3. The electrode plate processing device according to claim 2, wherein the waste adsorption mechanism further comprises a vacuum roller having one or more vacuum holes, and the one or more vacuum holes are disposed at an inner side of the conveyer belt and communicate with the negative pressure hole.

4. The electrode plate processing device according to claim 3, wherein in an axial direction of the vacuum roller, the vacuum roller comprises a vacuum section and a passing roller section that are connected to one another, the vacuum section is provided with the one or more vacuum holes, and the passing roller section is configured to support the electrode plate.

5. The electrode plate processing device according to claim 2, wherein at least one of the active driving roller and the driven support roller is a vacuum roller having one or more vacuum holes, and the one or more vacuum holes are disposed at an inner side of the conveyer belt and communicate with the negative pressure hole.

6. The electrode plate processing device according to claim 5, wherein the driven support roller is the vacuum roller, and a radial dimension of the driven support roller is greater than or equal to a radial dimension of the active driving roller.

7. The electrode plate processing device according to claim 5, wherein the vacuum roller has an adsorption region and a non-adsorption region that are arranged along a circumferential direction of the vacuum roller, and the adsorption region is provided with the one or more vacuum holes.

8. The electrode plate processing device according to claim 3, wherein the one or more vacuum holes comprise a plurality of vacuum holes, and the plurality of vacuum holes is arranged along a circumferential direction of the vacuum roller.

9. The electrode plate processing device according to claim 5, wherein a limit groove surrounding the vacuum roller is provided along a circumferential direction of the vacuum roller, the limit groove has a bottom wall provided with the one or more vacuum holes, and the conveyer belt is engaged in the limit groove.

10. The electrode plate processing device according to claim 1, wherein the waste adsorption mechanism further comprises a tension roller provided on an outer side of the conveyer belt, and configured to adjust a tension force of the conveyer belt.

* * * * *